(12) United States Patent
Ohtomo

(10) Patent No.: US 6,182,255 B1
(45) Date of Patent: Jan. 30, 2001

(54) IC TESTER

(75) Inventor: Hiroshi Ohtomo, Tokyo (JP)

(73) Assignee: Ando Electric Co., Ltd., Tokyo (JP)

(*) Notice: Under 35 U.S.C. 154(b), the term of this patent shall be extended for 0 days.

(21) Appl. No.: 09/157,016

(22) Filed: Sep. 18, 1998

(30) Foreign Application Priority Data

Sep. 26, 1997 (JP) .................................................... 9-262130

(51) Int. Cl.[7] ........................... G06F 11/00; G01R 31/28; G01R 29/00
(52) U.S. Cl. ......................... 714/724; 714/745; 714/815; 714/721
(58) Field of Search .................................... 714/724, 733, 714/734, 736, 735, 738, 739, 744, 745, 814, 815, 819; 324/763, 765, 73.1

(56) References Cited

U.S. PATENT DOCUMENTS

| 4,862,071 | * | 8/1989 | Sato et al. | 324/73.1 |
| 5,390,129 | * | 2/1995 | Rhodes | 702/118 |
| 5,745,499 | * | 4/1998 | Ong | 714/721 |

* cited by examiner

Primary Examiner—Christine T. Tu
(74) Attorney, Agent, or Firm—Flynn, Thiel, Boutell & Tanis, P.C.

(57) ABSTRACT

An IC tester enabling the performance of the decision of the conditions of output signals of the device under test in a period of time having a predetermined time interval between two decision trigger signals, thereby providing the IC tester capable of deciding the conditions of output signals of the device under test in a scope wider than that of the conventional IC tester. If the output voltage of each device under test is higher than a high reference voltage, it is decided that each device under test outputs a high signal while if the output voltage of the each device under test is lower than a low reference voltage, it is decided that each device under test outputs a low signal. If the output voltage of each device under test is lower than the high reference voltage but higher than the low reference voltage, it is decided that the output of each device under test is in high impedance.

13 Claims, 5 Drawing Sheets

FIG. 6 (A) (PRIOR ART)
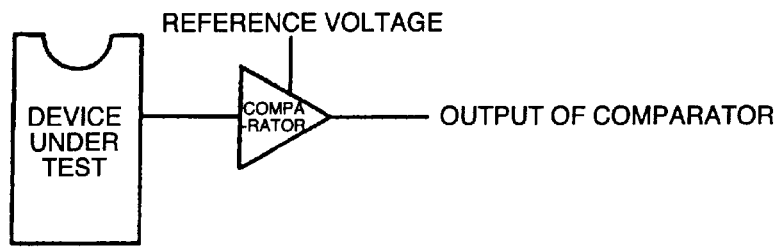
FIG. 6 (B) (PRIOR ART)
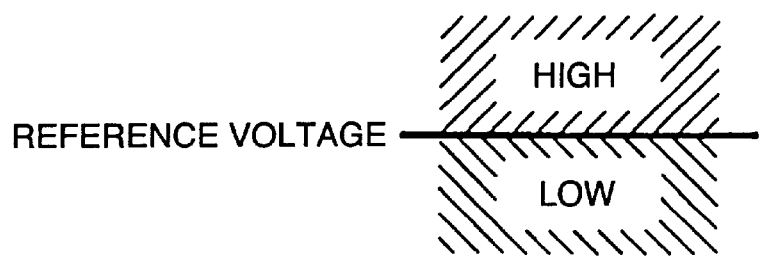
FIG. 7 (PRIOR ART)
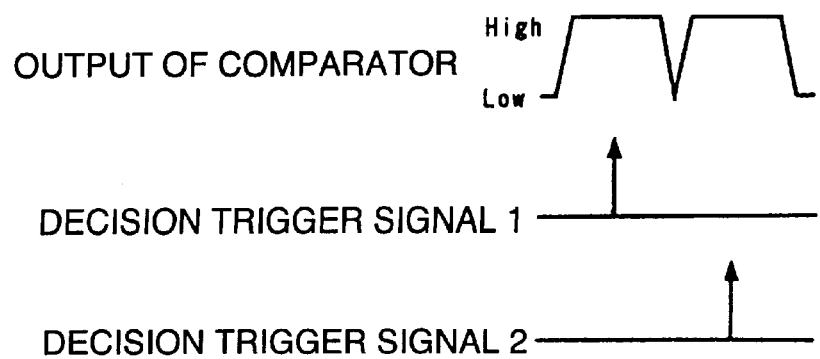

IC TESTER

BACKGROUND OF THE INVENTION

1. Field of the Invention

The present invention relates to an IC tester for testing a semiconductor integrated circuit, particularly relates to an IC tester which decides output values of devices under test and tests function and electric characteristics of the semiconductor integrated circuit.

2. Description of the Related Art

A variety of electronic devices have been recently quickly developed in an IC (Integrated Circuit). An IC, an LSI (Large Scale Integrated circuit), etc. realize the operations of respective elements such as a resistor, a capacitor, a transistor, by circuits which are formed by a printing method, evaporating method, etc. However, there occur slight variations in respective device characteristics between mass-produced devices. An IC tester tests whether the characteristics of the IC or LSI meet the standard or not.

In testing an IC by an IC tester, a pattern signal necessary for testing respective devices under test is inputted to given device pins of the device under test, and an output signal of the device under test relative to the pattern signal is decided by a decision circuit to decide the result of test. At that time, a comparator is connected to an output pin of the device under test as shown in FIG. 6(A), wherein a reference voltage is compared with an output voltage of the device under test by the comparator, so that the output of the comparator is rendered high signal if the output voltage is higher than the reference voltage, and it is rendered a low signal if the output voltage is lower than the reference voltage as shown in FIG. 6(B).

Further, as shown in FIG. 7, the decision circuit decides the result of test of the device under test by the conditions of output signals of the comparator at the timings of decision trigger signals respectively outputted from the timing generating circuit.

However, there are following problems in the conventional IC tester having the construction set forth above.

1. In the conventional comparator, since there is only one comparator relative to one output, and there is only one reference voltage, the comparison whether the voltage value of the output signal of each device under test is high signal or low signal is performed, so that the decision of the result of test by the decision circuit is performed in two manners, i.e., pass or failure of test of the device under test.

2. In the conventional decision circuit, only the decision of the result of test of each device under test has been conventionally performed only at one point along the time axis at the timings when the decision trigger signals are inputted, the decision of the condition of the device under test can not be performed in a period of time other than the aforementioned period of time.

SUMMARY OF THE INVENTION

It is therefore an object of the invention to solve the aforementioned first problem for enabling the performance of a high impedance decision in addition to the decision of the result, i.e. pass or failure of test of the device under test, and also to solve the aforementioned second problem for enabling the performance of the decision of the conditions of output signals of the device under test in a period of time having a predetermined time interval between two decision trigger signals, thereby providing the IC tester capable of deciding the conditions of output signals of the device under test in a scope wider than that of the conventional IC tester.

To achieve the above object, the IC tester according to the first aspect of the invention for generating a test signal for testing devices 3 under test and outputting the test signal to the devices 3 under test so as to analyze conditions of output signals of the devices 3 under test relative to the test signal, thereby testing the devices 3 under test, is characterized in including comparator means that compares the output signals of the devices 3 under test with a plurality of given reference voltage values so as to decide a plurality of conditions of output signals of the devices 3 under test.

According to the first aspect of the invention, the IC tester generates a test signal for testing devices 3 under test and outputting the test signal to the devices 3 under test, wherein when analyzing conditions of output signals of the devices 3 under test relative to the test signal, the comparator means compares the output signals of the devices 3 under test with a plurality of given reference voltage values so as to decide a plurality of conditions of output signals of the devices 3 under test.

Accordingly, although the IC tester performs only the decision of the result of test of the devices under test, it is possible to decide the condition of the devices under test other than the result of test in accordance with the conditions of output signals of the devices under test by deciding a plurality of conditions of output signals of the devices under test by comparing the output signals with a plurality of reference voltages.

The IC tester 1 according to a second aspect of the invention for generating a test signal for testing devices 3 under test and outputting the test signal to the devices 3 under test so as to analyze conditions of output signals of the devices 3 under test relative to the test signal, thereby testing the devices 3 under test, is characterized in including decision means that fetches the output signals of the devices 3 under test in a predetermined period of time, and compares the output signals with logical value signals representing logical output signals of the devices 3 under test relative to the test signal so as to decide the conditions of output signals of the devices 3 under test are equal to logical value or not.

According to the second aspect of the invention, the IC tester generates a test signal for testing devices 3 under test and outputting the test signal to the devices 3 under test, wherein when analyzing conditions of output signals of the devices 3 under test relative to the test signal, the decision means fetches the output signals of the devices 3 under test in a predetermined period of time, and compares the output signals with logical value signals representing logical output signals of the devices 3 under test relative to the test signal so as to decide the conditions of output signals of the devices 3 under test are equal to logical value or not.

Accordingly, although the scope of decision is narrowed because only the decision of the result of test of each device 3 under test has been conventionally performed at one point along the time axis at the timings of the decision trigger signals, it is possible to perform a wide scope of decision because the output signal of each device 3 under test is fetched and decided continuously in a given period of time.

The IC tester 1 according to a third aspect of the invention for generating a test signal for testing devices 3 under test and outputting the test signal to the devices 3 under test so as to analyze conditions of output signals of the devices 3 under test relative to the test signal, thereby testing the devices 3 under test, is characterized in including comparator means that compares the output signals of the devices 3 under test with a plurality of given reference voltage values so as to decide a plurality of conditions of output signals of the devices 3 under test, and decision means that fetches the output signals of the devices 3 under test in a predetermined period of time, and compares the output signals with logical value signals representing logical output signals of the devices 3 under test relative to the test signal so as to decide the conditions of output signals of the devices 3 under test are equal to logical value or not.

According to the third aspect of the invention, the IC tester generates a test signal for testing devices 3 under test and outputting the test signal to the devices 3 under test, wherein when analyzing conditions of output signals of the devices 3 under test relative to the test signal, the comparator means compares the output signals of the devices 3 under test with a plurality of given reference voltage values so as to decide a plurality of conditions of output signals of the devices 3 under test, and the decision means fetches the output signals of the devices 3 under test in a predetermined period of time, and compares the output signals with logical value signals representing logical output signals of the devices 3 under test relative to the test signal so as to decide the conditions of output signals of the devices 3 under test are equal to logical value or not.

Accordingly, although only the decision of the result of test of each device 3 under test has been conventionally performed at one point along the time axis at the timings of the decision trigger signals, it is possible to perform a wide scope of decision in kind of condition of output signal of each device 3 under test and in time because a plurality of conditions of output signals of the devices under test are decided by comparing the signals outputted from the devices under test with a plurality of reference voltage values, and the result of decision of test of each device 3 under test is fetched and decided continuously in a given period of time.

The IC tester 1 according to the fourth aspect of the invention is characterized in that the comparator means according to the first or third aspect of the invention comprises a plurality of comparators at which different reference voltage are set.

The IC tester 1 according to the fifth aspect of the invention is characterized in that the comparator means according to the fourth aspect of the invention comprises two groups of comparators for comparing and deciding three conditions of output signals of the devices under test, said three conditions being formed of a first condition that is higher than a relatively high reference voltage, a second condition that is higher than a relatively low reference voltage but lower than a relatively high reference voltage, and a third condition that is lower than the relatively low reference voltage, thereby deciding high impedance condition in addition to the result of test of the devices under test.

According to the fourth and fifth aspects of the invention, they have the effects in addition to those of the first and third aspects of the invention such that the reference voltages of a plurality of comparators are compared with the output voltages of the devices 3 under test, thereby specifying the scope of the output voltage values of the devices 3 under test so that the high impedance condition can be decided in addition to the result of decision of test of the devices 3 under test.

The IC tester 1 according to the sixth aspect of the invention is characterized in that the decision means according to the second or third aspect of the invention starts fetching of signals to be decided in response to a first decision trigger signal 1 which is generated at a given timing, and ends fetching of the signals to be decided in response to a second decision trigger signal 2 which is generated upon elapse of a given time from the first decision trigger signal 1, thereby deciding the conditions of output signals of the devices 3 under test in a period of time between the first and second decision trigger signals 1 and 2.

The sixth aspect of the invention has the effect in addition to those of the second and third aspects of the invention such that conventional circuit resources can be utilized because the time for deciding output condition of each device 3 under test is set utilizing the decision trigger signals which have been conventionally employed, and that the invention can be easily applied to a circuit for performing the decision by selectively and appropriately switching the conventional system and the system of the present invention.

BRIEF DESCRIPTION OF THE DRAWINGS

FIG. 6 is a view for explaining concepts of high and low signals using one reference voltage according to a conventional IC tester; and FIG. 7 is a view for explaining a concept of deciding method using deciding trigger signals according to the conventional IC tester.

PREFERRED EMBODIMENT OF THE INVENTION

Figure 1:
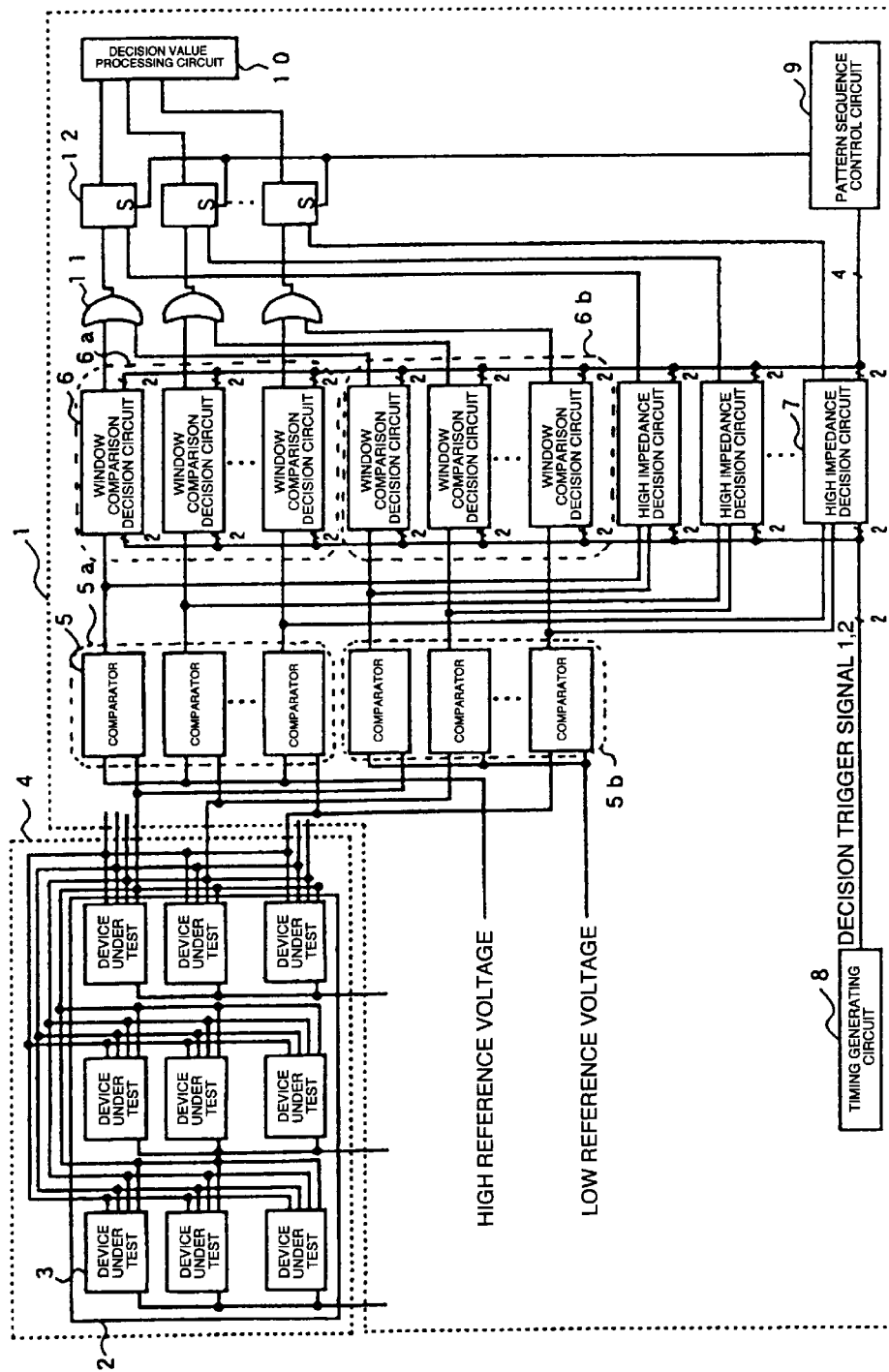
FIG. 1 is a block diagram showing a circuit construction of an IC tester according to a preferred embodiment of the invention.

FIG. 1 is a block diagram showing a circuit construction of an IC tester 1 according to the preferred embodiment of the invention.

In FIG. 1, the IC tester 1 comprises a timing generating circuit 8, a pattern sequence control circuit 9, a decision value processing circuit 10, a plurality of comparators 5, a plurality of window comparison decision circuits 6, a plurality of high impedance decision circuits 7, a plurality of OR gates 11, and a plurality of selectors 12, and the IC tester 1 is connected to a mounting board 2 on which a plurality of devices 3 under test are mounted Since the IC tester 1 has a construction in which a plurality of circuit components are arranged in parallel with one another, it can sequentially test the devices 3 under test one by one while they are mounted on the mounting board 2. Further, in FIG. 1, although a constant-temperature bath 4 is not an indispensable component, it is possible to construct a test burn-in system capable of performing an IC test in the atmosphere of various temperatures by providing the constant-temperature bath 4 in which inner temperatures can be arbitrarily changed.

The comparators 5 are divided into high voltage side comparators 5a at which a high reference voltage as a reference voltage is set and low voltage side comparators 5b to which a low reference voltage as a reference voltage is set. The internal circuit construction of each high voltage side comparator 5a is the same as that of each low voltage side comparator 5b. Output signals of the devices 3 under test are distributed to two paths and respectively outputted to the high voltage side comparators 5a and low voltage side comparators 5b.

The window comparison decision circuits 6 comprise high voltage window comparison decision circuits 6a which receive signals outputted from the high voltage side comparators 5a and low voltage window comparison decision circuits 6b which receive signals from the low voltage side comparators 5b. The internal circuit construction of each high voltage window comparison decision circuit 6a is the same as that of each low voltage window comparison decision circuit 6b.

The high voltage side comparators 5a compare voltage values of signals outputted from the devices 3 under test with the high reference voltage, and they output high signals to high voltage window comparison decision circuits 6a if the voltage value of each signal outputted from the devices 3 under test is higher than the high reference voltage, while they output low signals to the high voltage window comparison decision circuits 6a if the voltage value of each signal outputted from the devices 3 under test is lower than the low reference voltage.

Likewise, the low voltage side comparators 5b compare voltage values of signals outputted from the devices 3 under test with the low reference voltage, and they output high signals to high voltage window comparison decision circuits 6b if the voltage value of each signal outputted from the devices 3 under test is higher than the low reference voltage, while they output low signals to the low voltage window comparison decision circuits 6b if the voltage value of each signal outputted from the devices 3 under test is lower than the low reference voltage.

The internal circuit of each window comparison decision circuit 6 will be now described with reference to FIG. 2.

Figure 2:
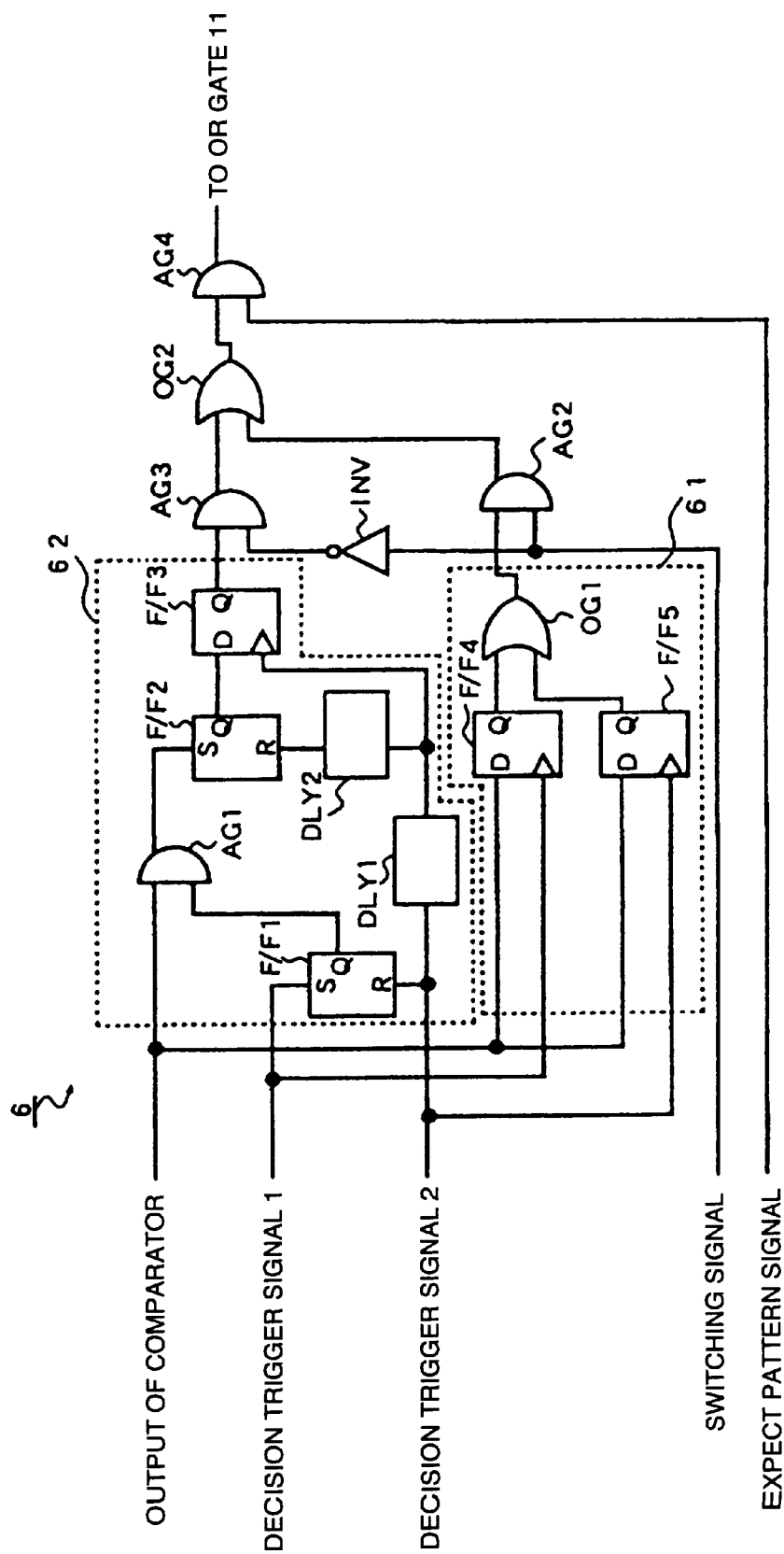
FIG. 2 is a block diagram showing an internal circuit construction of a window comparison decision circuit 6 in FIG. 1.

In FIG. 2, each window comparison decision circuit 6 comprises flip-flops F/F1 to F/F5, AND gates AG1 to AG4, OR gates OG1 and OG2, delay lines DLY1 and DLY2 and an inverter INV.

Each window comparison decision circuit 6 functionally comprises an edge decision part 61 composed of the flip-flop F/F4 and flip-flop F/F5, and the OR gate OG1, and a window decision part 62 composed of the flip-flops F/F1 to F/F3, delay lines DLY1 and DLY2 and the AND gate AG1.

The flip-flop F/F1 is set by a decision trigger signal 1 which is inputted earlier in time to a set terminal S so as to output a high signal from a data output terminal Q thereof to the AND gate AG1, while it is reset by a decision trigger signal 2 which is inputted later in time to a reset terminal R thereof so as to output a low signal from the data output terminal Q thereof to the AND gate AG1, thereby outputting the high signal to the AND gate AG1 only in a period of time during a decision trigger signal 1 and a decision trigger signal 2 alone which are respectively outputted from the timing generating circuit 8.

The AND gate AG1 performs AND operation between a signal outputted from each comparator 5 and a signal outputted from the flip-flop F/F1, and outputs the ANDed signal to a set terminal S of the flip-flop F/F2. That is, the AND gate AG1 outputs the signal outputted from each comparator 5 to the set terminal S of the flip-flop F/F2 only in a period of time between the decision trigger signal 1 and decision trigger signal 2 when the flip-flop F/F1 outputs the high signal, while the AND gate AG1 outputs a low signal to the set terminal S of the flip-flop F/F2 in a period of time other than the aforementioned period of time.

The delay line DLY1 delays the decision trigger signal 2 outputted from the timing generating circuit 8 by a given time, and outputs the delayed decision trigger signal 2 to a clock terminal of the flip-flop F/F3 and the delay line DLY2. The delay line DLY2 delays the decision trigger signal 2, which is outputted from the delay line DLY1 and delayed by the given time by a further given time, and outputs the further delayed decision trigger signal 2 to a reset terminal R of the flip-flop F/F2.

The flip-flop F/F2 is reset when receiving the high signal from the AND gate AG1, and outputs the high signal from a data output terminal Q thereof to a data input terminal D of the flip-flop F/F3, while it is reset when receiving the high signal from the delay line DLY2 and outputs a low signal from the data output terminal Q thereof to the data input terminal D of the flip-flop F/F3.

The flip-flop F/F3 latches the signal which is inputted to the data input terminal D thereof from the flip-flop F/F2 at the edge of the signal outputted from the delay line DLY1 to the clock terminal thereof, and outputs the latched signal from a data output terminal Q thereof to the AND gate AG3.

The flip-flop F/F4 latches the signal which is outputted from each comparator 5 to a data input terminal D thereof at the edge of the decision trigger signal 1 outputted from the timing generating circuit 8 to a clock terminal thereof, and outputs the latched signal from a data output terminal Q to the OR gate OG1.

Likewise, the flip-flop F/F5 latches the signal which is outputted from each comparator 5 to a data input terminal D thereof at the edge of the decision trigger signal 2 outputted from the timing generating circuit 8 to a clock terminal thereof, and outputs the latched signal from the data output terminal Q thereof to the OR gate OG1.

The OR gate OG1 performs OR operation between signals outputted from the flip-flop F/F4 and flip-flop F/F5, and outputs the ORed signal to the AND gate AG2.

The AND gate AG2 performs AND operation between the signals outputted from the OR gate OG1 and a switching signal outputted from the pattern sequence control circuit 9, and outputs the ANDed signal to the OR gate OG2.

The AND gate AG3 performs AND operation between the signals outputted from the flip-flop F/F3 and the switching signal which is outputted from the pattern sequence control circuit 9 and inverted by the inverter INV, and outputs the ANDed signal to the OR gate OG2.

The OR gate OG2 performs OR operation between the signal outputted from the AND gate AG2 and the signal outputted from the AND gate AG3, and outputs the ORed signal to the AND gate AG4.

The AND gate AG4 performs AND operation between the signal outputted from the OR gate OG2 and an expect pattern signal outputted from the pattern sequence control circuit 9, and outputs the ANDed signal to the OR gate 11 provided outside each window comparison decision circuit 6.

Depending on each window comparison decision circuit 6 being included in the high voltage window comparison decision circuits 6a or low voltage window comparison decision circuits 6b, either of a high expect pattern signal corresponding to the output signals of the high voltage side comparators 5a or a low expect pattern signal corresponding to output signals of the low voltage side comparators 5b is appropriately outputted from the pattern sequence control circuit 9 as the expect pattern signal.

Each window comparison decision circuit 6 having the internal circuit construction as set forth above compares the signal outputted from each comparator 5 with the expect pattern signal outputted from the pattern sequence control circuit 9 at the timings of the decision trigger signal 1 and the decision trigger signal 2 respectively outputted from the timing generating circuit 8 if the switching signal outputted from the pattern sequence control circuit 9 is a signal for setting a normal edge decision (decision is performed at the timings of the edges of the decision trigger signals), thereby deciding the normal edge decision, and outputting a signal representing the result of decision to the OR gate 11.

Meanwhile, if the switching signal outputted from the pattern sequence control circuit 9 is a signal for setting a real time window decision (real time decision is performed in a period of time between the decision trigger signal 1 and the decision trigger signal 2), each window comparison decision circuit 6 compares the signal outputted from each comparator 5 with the expect pattern signal outputted from the pattern sequence control circuit 9 in a period of time between the decision trigger signal 1 and the decision trigger signal 2 respectively outputted from the timing generating circuit 8, thereby performing the real time window decision, and outputting a signal representing the decision of result to the OR gate 11.

Figure 3:
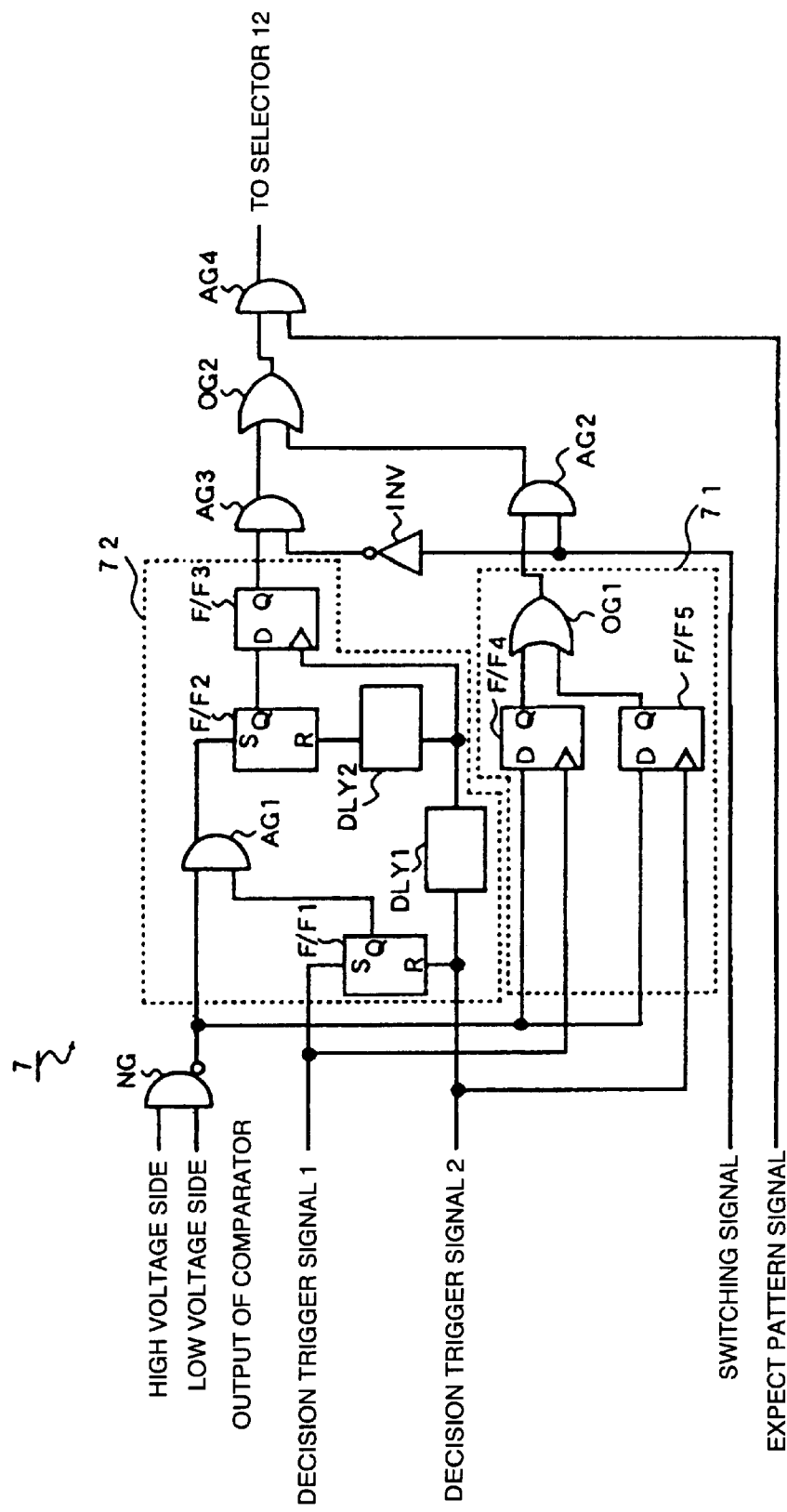
FIG. 3 is a block diagram showing an internal circuit construction of a high impedance decision circuit 7 in FIG. 1.

Inasmuch as the internal construction of each high impedance decision circuit 7 shown in FIG. 3 is substantially the same as that of each window comparison decision circuit 6 shown in FIG. 2, components which are the same as those in FIG. 2 are denoted by the same reference numerals, and the detailed explanation thereof is omitted.

Each high impedance decision circuit 7 functionally comprises an edge decision part 71 composed of the flip-flop F/F4, the flip-flop F/F5, and the OR gate OG1, and a window decision part 72 composed of the flip-flops F/F1 to F/F3, the delay lines DLY1 and DLY2 and the AND gate AG1.

In FIG. 3, the internal circuit construction of the high impedance decision circuit 7 is different from that of the window comparison decision circuit 6 in that the former has a NAND gate NG at the input stage thereof for receiving the outputted signal from each comparator 5. Outputted signals from high voltage side comparators 5a and low voltage side comparators 5b which are respectively connected to the same device pins as those of the devices 3 under test are inputted to the NAND gate NG.

The NAND gate NG performs NAND operation between the output signals from the high voltage side comparators 6a and low voltage side comparators 5b respectively connected to the same device pins as those of the devices 3 under test, and outputs the NANDed signal to the AND gate AG1, the data input terminal D of the flip-flop F/F4, and the data input terminal D of the flip-flop F/F5.

Other components of each high impedance decision circuit 7 are the same as those of each window comparison decision circuit 6 in FIG. 2. Each high impedance decision circuit 7 compares a signal representing the result of NAND operation performed by the NAND gate NG between output signals from the high voltage side comparators 5a and low voltage side comparators 5b at the timings of the decision trigger signal 1 and the decision trigger signal 2 which are respectively outputted from the timing generating circuit with the expect pattern signal outputted from the pattern sequence control circuit 9, if the switching signal outputted from the pattern sequence control circuit 9 is a signal for setting the high impedance decision by a normal edge decision, thereby performing high impedance decision by the normal edge decision, and outputting a signal representing the result of decision to the selector 12.

Each high impedance decision circuit 7 compares a signal representing the result of NAND operation performed by the NAND gate NG between output signals from the high voltage side comparators 5a and low voltage side comparators 5b in a period of time between the decision trigger signal 1 and the decision trigger signal 2 which are respectively outputted from the timing generating circuit 8 with the expect pattern signal outputted from the pattern sequence control circuit 9 if the switching signal outputted from the pattern sequence control circuit 9 is a signal for setting the high impedance decision by a real time window decision, thereby performing high impedance decision by the real time window decision, and outputting a signal representing the result of decision to the selector 12.

The timing generating circuit 8 generates the decision trigger signal 1 and the decision trigger signal 2 for comparing the output signals based on timing data serving as information relating to a decision timing, and outputs them to the window comparison decision circuit 6 and the high impedance decision circuit 7.

The OR gates 11 receive the output signals of the high voltage window comparison decision circuits 6a and the low voltage window comparison decision circuits 6b which respectively process the output signals of the high voltage side comparators 5a and the output signals from the low voltage side comparators 5b wherein the high voltage side comparators 5a and the low voltage side comparators 5b are respectively connected to the same devices as those of the devices 3 under test, and they perform OR operation between these output signals, then they output the ORed signals to the selectors 12. That is, the OR gates 11 synthesize signals representing the result of decision which are processed through the high voltage side comparators 5a and the high voltage window comparison decision circuits 6a, and signals representing the decision of result processed through the low voltage side comparators 5b and the low voltage window comparison decision circuits 6b, and they output the synthesized signals to the selectors 12.

The pattern sequence control circuit 9 outputs the switching signal for switching to a normal edge decision or to a real time window decision to all the window comparison decision circuits 6 and high impedance decision circuits 7, and also outputs the expect pattern signal for deciding the output signals of the high voltage side comparators 5a to the high voltage window comparison decision circuits 6a while it outputs another expect pattern signal for deciding output signals of the low voltage side comparators 5b to the low voltage window comparison decision circuits 6b, and also it outputs still another expect pattern signal for performing high impedance decision to the high impedance decision circuits 7.

The selectors 12 appropriately select the synthesized signals representing the result of decision outputted from the OR gates 11 and signals representing the result of high impedance decision outputted from high impedance decision circuits 7 in response to select signals inputted to select terminals S from the pattern sequence control circuit 9, and output the selected signals to the decision value processing circuit 10.

The decision value processing circuit 10 analyzes signals representing the result of decision outputted from a plurality of selectors 12 corresponding to the device pins of the respective devices 3 under test, and processes the result of test of the devices 3 under test.

The operation of the IC tester 1 will be now conceptually described with reference to FIGS. 4(A), 4(B) and 5.

Figure 4:
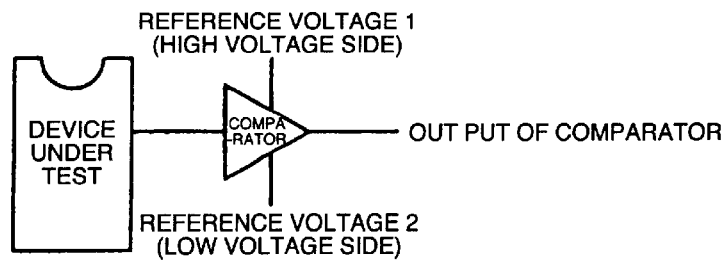
FIGS. 4(A) and 4(B) are views for explaining concepts of high and low signals, and high impedance decision using two reference voltages in the IC tester according to the preferred embodiment of the invention.
Figure 4:
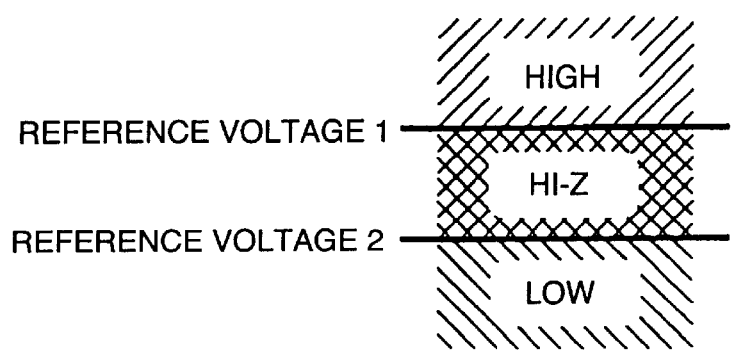

Although in the conventional IC tester, one comparator has conventionally compared signals relative to one reference voltage as shown in FIG. 6, in the IC tester of the present invention, two comparators compare signals relative to two reference voltages, wherein the possibility of performing the high impedance decision in addition to the result of test of the result of test of the devices 3 under test is illustrated in FIG. 4.

That is, as shown in FIG. 4(B), if the output voltage of each device 3 under test is higher than a high reference voltage 1, it is decided that each device 3 under test outputs a high signal while if the output voltage of the each device 3 under test is lower than a low reference voltage 2, it is decided that each device 3 under test outputs a low signal. If the output voltage of 20 each device 3 under test is lower than the high reference voltage 1 but higher than the low reference voltage 2, it is decided that the output of each device 3 under test is in high impedance.

In FIG. 4(A), two comparators are conceptually illustrated by one comparator as a symbol.

Figure 5:
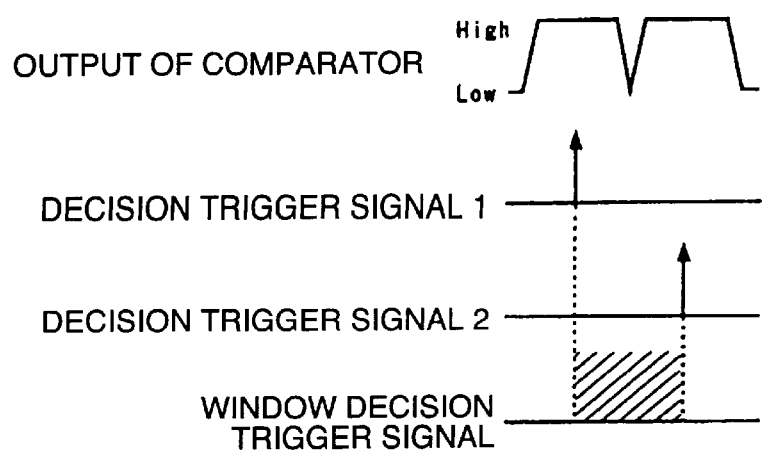
FIG. 5 is a view for explaining a concept of a deciding method using a window decision trigger signal in the IC tester 1 of the preferred embodiment of the invention.

The conventional IC tester has decided the test of result at the timings of decision trigger signals as shown in FIG. 7, whereas the IC tester of the present invention has a possibility of deciding the conditions of output signals of each device 3 under test can be decided at real time within the time when the window decision trigger signal is outputted while generating a window decision trigger signal having a time interval corresponding to a period of time between the decision trigger signal 1 and the decision trigger signal 2, as illustrated in FIG. 5.

S The operation of the IC tester 1 for realizing the conceptual operation will be now described.

A plurality of devices 3 under test are mounted on the mounting board 2 as shown in FIG. 1, and one device 3 under test of the devices 3 under test is selected by an output enable signal from the IC tester 1, and devices 3 under test are tested one by one.

A pattern signal necessary for testing respective devices 3 under test mounted on the mounting board 2 is outputted from the IC tester 1, one device 3 under test which is ready to output a signal in response to an output enable signal outputs a signal to the corresponding comparator 5 through its device pins. The output signals of the devices 3 under test are respectively outputted to the high voltage side comparators 5a and the low voltage side comparators 5b which respectively correspond to device pins.

Each voltage value of the output signals of each device 3 under test which is inputted to each high voltage side comparator 5a is compared with the high reference voltage. If the voltage value of the output signal of the device 3 under test is higher than the high reference voltage, the high signal is outputted to each high voltage window comparison decision circuit 6a and each high impedance decision circuit 7, while if the voltage value of the output signal of each device 3 under test is lower than the high reference voltage, the low signal is outputted to each high voltage window comparison decision circuit 6a and high impedance decision circuits 7. Likewise, the voltage value of the output signal of the device 3 under test which is inputted to each low voltage side comparator 5b is compared with the low reference voltage. If the voltage value of the output signal of the device 3 under test is higher than the low reference voltage, the high signal is outputted to each low voltage window comparison decision circuit 6b and each high impedance decision circuit 7 while if the voltage value of the output signal of the device 3 under test is lower than the low reference voltage, the low signal is outputted to each low voltage window comparison decision circuit 6b and each high impedance decision circuit 7.

The signal outputted from each high voltage side comparator 5a is inputted to each high voltage window comparison decision circuit 6a so that a signal which is generated by the operation of the window comparison decision circuit 6 and represents the result of test of each device 3 under test relative to the high reference voltage is outputted to each OR gate 11. Likewise, the signal outputted from each low voltage side comparator 5b is inputted to each low voltage window comparison decision circuit 6b so that a signal which is generated by the operation of the window comparison decision circuit 6 and represents the result of test of each device 3 under test relative to the low reference voltage is outputted to each OR gate 11.

The signals representing the result of decision which are respectively inputted to the OR gates 11 through the high voltage window comparison decision circuits 6a and the low voltage window comparison decision circuits 6b respectively corresponding to the same device pins as those of the devices 3 under test are ORed by the OR gates 11, so that these signals are synthesized and outputted to the selectors 12.

Meanwhile, the signals inputted to the high impedance decision circuits 7 through the high voltage side comparators 5a and low voltage side comparators 5b respectively corresponding to the same device pins as those of the devices 3 under test are subjected to high impedance decision by the operation of the high impedance decision circuits 7 so that signals representing the result of high impedance decision of the devices 3 under test are outputted to the selectors 12.

The signals representing the result of test outputted from the OR gates 11 and the signals representing the result of high impedance decision outputted from the high impedance decision circuits 7 are respectively inputted to the selectors 12, wherein either of them is selected in response to the select signal inputted to the select terminals S of the selectors 12 from the pattern sequence control circuit 9, and the selected signals are outputted to the decision value processing circuit 10. The decision value processing circuit 10 analyzes the result of decision so that the result of test of the devices 3 under test is processed thereby.

The operations of the window comparison decision circuits 6 and the high impedance decision circuits 7 which are respectively switched by the switching signal outputted from the pattern sequence control circuit 9 will be now described in detail.

In FIG. 2, the edge decision part 61 performs a normal edge decision which has been conventionally performed.

The output signal of each comparator 5 inputted to the flip-flop F/F4 is latched therein at the timing of the edge of the decision trigger signal 1 which is inputted to the clock terminal of the flip-flop F/F4 from the timing generating circuit 8, and the latched signal is outputted from the data output terminal Q thereof to the OR gate OG1.

Likewise, the output signal of each comparator 5 inputted to the flip-flop F/F5 is latched therein at the timing of the edge of the decision trigger signal 2 which is inputted to the clock terminal of the flip-flop F/F5 from the timing generating circuit 8, and the latched signal is outputted from the data output terminal Q thereof to the OR gate OG1.

The signals outputted from the flip-flop F/F4 and the flip-flop F/F5 are respectively inputted to the OR gate OG1 and they are ORed by the OR gate OG1 so that the signal which is made effective by either of the decision trigger signal 1 or the decision trigger signal 2 which are inputted from the timing generating circuit 8 to the window comparison decision circuit 6 is outputted to the AND gate AG2.

That is, the edge decision part 61 performs decision by latching the conditions of the output signals of the comparators 5 in the flip-flops at the timing of the decision trigger signal 1 or decision trigger signal 2 which is outputted from the timing generating circuit 8.

Meanwhile, the window decision part 62 performs the window decision for deciding the conditions of the output signals of the comparators 5 in a period of time having a given time interval.

The decision trigger signal 1 that is inputted from the timing generating circuit 8 to the window comparison decision circuits 6 is inputted to the set terminal S of the flip-flop F/F1 to set the flip-flop F/F1 while the decision trigger signal 2 is inputted to the reset terminal R of the flip-flop F/F1 to reset the flip-flop F/F1. Accordingly, the output signal of the flip-flop F/F1 becomes a high signal until the decision trigger signal 2 is inputted thereto after the decision trigger signal 1 is inputted thereto, and it becomes a low signal in a period of time other than the aforementioned period of time, and this output signal is outputted to the AND gate AG1.

The AND gate AG1 outputs the signal inputted to each comparator 5 to the set terminal S of the flip-flop F/F2 until the decision trigger signal 2 is inputted thereto after the decision trigger signal 1 is inputted thereto, while it outputs the low signal to the set terminal S of the flip-flop F/F2 in a period of time other than the aforementioned period of time. That is, the flip-flop F/F2 is set to output a high signal when the output signal of each comparator 5 becomes a high signal until the decision trigger signal 2 is inputted thereto after the decision trigger signal 1 is inputted thereto.

Since the decision trigger signal 2 inputted from the timing generating circuit 8 to the window comparison decision circuits 6 is delayed by the delay line DLY1 and the delay line DLY2, then it is inputted to the reset terminal R of the flip-flop F/F2, the flip-flop F/F2 is reset upon elapse of a given time after the signal inputted to the set terminal S of the flip-flop F/F2 is switched from the signal outputted from each comparator 5 to the low signal at the timing of the decision trigger signal 2. As a result, the flip-flop F/F3 can obtain set up time when the signal outputted from the flip-flop F/F2 is inputted to the data input terminal D thereof.

The output signal of the flip-flop F/F2 is inputted to the data input terminal D of the flip-flop F/F3, and it is delayed by the delay line DLY1 by a given time, then it is latched in the flip-flop F/F3 at the timing of the edge of the decision trigger signal 2 inputted to the clock terminal thereof, and finally the latched signal is outputted from the data output terminal Q thereof to the AND gate AG3.

That is, the window decision part 62 latches the condition of the output signal of each comparator 5 in the flip-flop F/F3 in a period of time between the decision trigger signal 1 and decision trigger signal 2 respectively outputted from the timing generating circuit 8, thereby performing the decision.

In FIG. 2, the AND gate AG2, the inverter INV and the AND gate AG3 contribute to the switching operation of the window comparison decision circuits 6. That is, if the switching signal is a high signal, the AND gate AG2 outputs a signal representing the result of a normal edge decision outputted from the edge decision part 61 to the OR gate OG2, so that the AND gate AG3 is always in a state to output a low signal, while if the switching signal is a low signal, the AND gate AG2 is always in a state to output a low signal so that the AND gate AG3 outputs a signal representing the result of a window decision outputted from the window decision part 62 to the OR gate OG2.

The signals outputted from the AND gate AG2 and the AND gate AG3 are inputted to the OR gate OG2 where these inputted signals are ORed, so that the signal which is effective by the switching signal which is inputted from the pattern sequence control circuit 9 to the window comparison decision circuit 6 is outputted to the AND gate AG4.

Further, the signal which is effective by the switching signal is compared with the expect pattern signal which is outputted from the pattern sequence control circuit 9 by the AND gate AG4, so that the high signal is outputted to the OR gate 11 when both signals are respectively the high signal and the low signal is outputted to the OR gate 11 when both signals are not the high signal.

In FIG. 3, the edge decision part 71 performs a normal edge decision which has been conventionally performed, and a window decision part 72 performs a window decision for deciding the condition of the output signal of each comparator 5 in a period of time having a given time interval.

Although the operation of each high impedance decision circuit 7 is substantially the same as that of each window comparison decision circuit 6, there is provided the NAND gate NG for receiving the output signal of each comparator 5 at the input stage of the high impedance decision circuit 7. The NAND gate NG performs NAND operation between the output signals of the high voltage side comparators 5a and the low voltage side comparators 5b respectively connected to the same device pins as those of the devices 3 under test, thereby enabling high impedance decision.

That is, the NAND gate NG outputs a high signal only when the input signals from the high voltage side comparators 5a are low signals and the input signals from the low voltage side comparators 5b are high signals, and a high impedance decision is performed when the high signal is latched in the flip-flops by the operation which is the same as the operation of the internal circuit of each window comparison decision circuit 6.

As explained above, according to the IC tester 1 of the preferred embodiment of the invention, the comparators 5 are divided into the high voltage side comparators 5a at which the high reference voltage is set and the low voltage side comparators 5b at which the low reference voltage is set, and the output signals of the devices 3 under test are distributed to two paths and respectively outputted to the high voltage side comparators 5a and low voltage side comparators 5b.

The window comparison decision circuits 6 are divided into the high voltage window comparison decision circuits 6a for receiving signals outputted from the high voltage side comparators 5a and the low voltage window comparison decision circuits 6b for receiving signals outputted from the low voltage side comparators 5b, wherein each window comparison decision circuit 6 compares the signal outputted from the comparator 5 with the expect pattern signal outputted from the pattern sequence control circuit 9 at the timings of the decision trigger signal 1 and decision trigger signal 2, thereby performing the normal edge decision if the switching signal outputted from the pattern sequence control circuit 9 is a signal for setting a normal edge decision, while it also compares the signal outputted from the comparator 5 with the expect pattern signal outputted from the pattern sequence control circuit 9 in the period of time between the decision trigger signal 1 and decision trigger signal 2 respectively outputted from the timing generating circuit 8, thereby performing a real time window decision if the switching signal outputted from the pattern sequence control circuit 9 is a signal for setting a real time window decision, thereby outputting a signal representing the result of decision to the OR gate 11. The OR gate 11 synthesizes a signal representing the result of decision which is processed through the high voltage side comparators 5a and high voltage window comparison decision circuits 6a and the signal representing the result of decision which is processed through the low voltage side comparators 5b and low voltage window comparison decision circuits 6b, and it outputs the synthesized signal to the selector 12.

Each high impedance decision circuit 7 compares a signal representing the result of the NAND operation performed by the NAND gate NG between the signals outputted from the high voltage side comparators 5a and low voltage side comparators 5b at the timings of the decision trigger signal 1 and decision trigger signal 2 respectively outputted from the timing generating circuit 8 with the expect pattern signal outputted from the pattern sequence control circuit 9 if the switching signal outputted from the pattern sequence control circuit 9 is a signal for setting the high impedance decision by the normal edge decision, thereby performing the high impedance decision by the normal edge decision, while it compares a signal representing the result of the NAND operation performed by the NAND gate NG between the signals outputted from the high voltage side comparators 5a and low voltage side comparators 5b in the period of time between the decision trigger signal 1 and decision trigger signal 2 respectively outputted from the timing generating circuit 8 with the expect pattern signal outputted from the pattern sequence control circuit 9 if the switching signal outputted from the pattern sequence control circuit 9 is a signal for setting the high impedance decision by the real time window decision, thereby performing the high impedance decision by the real time window decision, and it outputs a signal representing the result of decision to the selector 12.

Further, each selector 12 appropriately selects the signal representing the result of decision which is synthesized and outputted from the OR gate 11 in accordance with the select signal which is outputted from the pattern sequence control circuit 9 to the select terminal S or the signal representing the result of high impedance decision outputted from the high impedance decision circuit 7, and it outputs the selected signal to the decision value processing circuit 10.

Accordingly, it is possible to decide the anomaly of the condition of output signal of each device 3 under test in certain period time because the IC tester 1 can perform the window decision. Further, it is possible to perform the high impedance decision and test of each device 3 under test in the case where the output enable signal of each device 3 under test is controlled by the IC tester 1 to perform the decision of output signal of each device 3 under test because the IC tester 1 can perform the high impedance decision. Still further, it is possible to decide the anomaly of the output impedance condition of each device 3 under test in a certain period of time in the case where the output enable signal of each device 3 under test is controlled by the IC tester 1 to perform the decision of output signal of each device 3 under test because the IC tester 1 can perform the high impedance decision by the window decision.

According to the first aspect of the invention, although the IC tester 1 has conventionally performed the decision of only the result of test of each device 3 under test, the IC tester 1 of the present invention compares the signals with a plurality of reference voltage values, thereby capable of deciding a plurality of conditions of output signals of the devices 3 under test and of deciding the condition other than the result of test depending on the output condition of each device 3 under test.

According to the second aspect of the invention, although the scope of decision is narrowed because only the decision of the result of test of each device 3 under test has been conventionally performed at one point along the time axis at the timings of the decision trigger signals, it is possible to perform a wide scope of decision because the output signal of each device 3 under test is fetched and decided continuously in a given period of time.

According to the third aspect of the invention, although only the decision of the result of test of each device 3 under test has been conventionally performed at one point along the time axis at the timings of the decision trigger signals, it is possible to perform a wide scope of decision in kind of condition of output signal of each device 3 under test and in time because a plurality of conditions of output signals of the devices under test are decided by comparing the signals outputted from the devices under test with a plurality of reference voltage values, and the result of decision of test of each device 3 under test is fetched and decided continuously in a given period of time.

The fourth and fifth aspects of the invention have the effects in addition to those of the first and third aspects of the invention such that the reference voltages of a plurality of comparators are compared with the output voltages of the devices 3 under test, thereby specifying the scope of the output voltage values of the devices 3 under test so that the high impedance condition can be decided in addition to the result of decision of test of the devices 3 under test.

The sixth aspect of the invention has the effect in addition to those of the second and third aspects of the invention such that conventional circuit resources can be utilized because the time for deciding output condition of each device 3 under test is set utilizing the decision trigger signals which have been conventionally employed, and that the invention can be easily applied to a circuit for performing the decision by selectively and appropriately switching the conventional system and the system of the present invention.

What is claimed is:

1. An IC tester generating a test signal for testing devices under test and outputting the test signal to the devices under test so as to analyze conditions of output signals of the devices under test relative to the test signal, said IC tester including:

comparator means for comparing the output signals of the devices under test with a plurality of given reference voltage values; and decision means for receiving comparator output signals from the comparator means in a predetermined period of time, and for comparing the comparator output signals with logical value signals representing logical output signals of the devices under test relative to the test signal so as to decide whether the conditions of the output signals of the devices under test are equal to a logical value, wherein said decision means starts fetching of the comparator output signals in response to a first decision trigger signal which is generated at a given timing, and ends fetching of the comparator output signals in response to a second decision trigger signal which is generated upon elapse of a given time from the first decision trigger signal, thereby deciding the conditions of the output signals of the devices under test in a period of time between the first and second decision trigger signals.

2. An IC tester for a device under test to analyze conditions of output signals of the device under test relative to a test signal, said IC tester including:

a high voltage comparator for comparing the output signal of the device under test with a high reference voltage value;

a low voltage comparator for comparing the output signal of the device under test with a low reference voltage value; and a high impedance decision circuit including a NAND gate for receiving the output of the high voltage comparator and the output of the low voltage comparator and including a window decision part for storing the condition of the NAND gate, the high impedance decision circuit outputting a high impedance signal when the value of the voltage of the output signal of the device under test is less than the high reference voltage value and greater than the low reference voltage value.

3. The IC tester of claim 2, wherein the high impedance decision circuit receives first and second trigger decision signal and includes an edge decision part for sensing an edge of the trigger signals and for enabling the latching of the condition of the NAND gate after the first trigger signal and before the second trigger signal.

4. The IC tester of claim 2, wherein the high impedance decision circuit includes circuitry for comparing the stored condition of the NAND gate with an expect pattern signal from a pattern sequence control circuit.

5. An IC tester for a device under test to analyze conditions of output signals of the device under test relative to a test signal, said IC tester including:

a high voltage comparator for comparing the output signal of the device under test with a high reference voltage value;

a high voltage window comparison decision circuit for receiving the output of the high voltage comparator and for storing a high voltage window comparison decision signal;

a low voltage comparator for comparing the output signal of the device under test with a low reference voltage value;

a low voltage window comparison decision circuit for receiving the output of the low voltage comparator and storing a low voltage window comparison decision signal; and a high impedance decision circuit for receiving the output of the high voltage comparator and the output of the low voltage comparator, the high impedance decision circuit outputting a high impedance signal when the value of the voltage of the output signal of the device under test is less than the high reference voltage value and greater than the low reference voltage value.

6. The IC tester of claim 5, including:

a logic gate for receiving the high voltage window comparison decision signal and the low voltage window comparison decision signal and for outputting a combined comparison decision signal;

a select or for receiving and outputting one of the combined comparison decision signal and the high impedance signal in response to a signal from a pattern sequence control circuit; and a decision value processing circuit for receiving the output from the selector.

7. The IC tester of claim 5, including a timing generating circuit for outputting first and second decision trigger signals, and wherein the high and low voltage window comparison decision circuits receive the first and second decision trigger signals and store the condition of the corresponding high or low comparator output signal after the first decision trigger signal and before the second decision trigger signal.

8. The IC tester of claim 7, wherein the high and low window comparison decision circuits each include a window decision part for storing the condition of the corresponding high or low comparator output signal and an edge decision part for sensing the edge of the trigger signals to enable the latching.

9. The IC tester of claim 8, wherein the high window comparison decision circuits each include circuitry for comparing the stored condition of the corresponding high comparator output signal with an expect pattern signal from a pattern sequence control circuit to generate the window comparison decision signal.

10. The IC tester of claim 5, wherein each connecting pin of the device under test that provides an output signal is connected to a pair of said high and low voltage comparators, a pair of said high and low voltage window comparison decision circuits, and a high impedance decision circuit.

11. An IC tester generating a test signal and outputting the test signal to devices under test so as to analyze conditions of output signals of the devices under test, said IC tester including:

decision means for receiving the output signals, the decision means including comparator means for determining the conditions of the output signals, the decision means fetching the conditions of the output signals during a predetermined period of time and the comparator means comparing the fetched conditions of the output signals with reference signals representing reference conditions so as to decide whether or not the conditions of the output signals of the devices under test are equal to a reference condition; and window comparison decision circuits for receiving the outputs of the comparator means, wherein said decision means starts fetching of the conditions of the output signals in response to a first trigger signal which is generated at a given time, and ends fetching of the conditions in response to a second trigger signal which is generated upon elapse of the predetermined time from the first trigger signal, thereby deciding the conditions of the output signals of the devices under test during the predetermined period of time between the first and second trigger signals.

12. The IC tester of claim 11, including a timing generating circuit for outputting the first and second trigger signals.

13. An IC tester generating a test signal and outputting the test signal to devices under test so as to analyze conditions of output signals of the devices under test, said IC tester including:

decision means for receiving the output signals and determining the conditions of the output signals and for fetching the conditions of the output signals during a predetermined period of time and including comparator means for comparing the output signals of the devices under test with a plurality of reference voltage values representing reference conditions so as to decide whether or not the conditions of the output signals of the devices under test are equal to a reference condition, wherein the comparator means includes high voltage comparators for comparing the output signals of the devices under test with a high reference voltage value, and low voltage comparators for comparing the output signals of the devices under test with a low reference voltage value, and wherein the decision means includes high voltage window comparison decision circuits for receiving the output of the high voltage comparators and for storing high voltage window comparison decision signals; and low voltage window comparison decision circuits for receiving the outputs of the low voltage comparators and storing low voltage window comparison decision signals, wherein said decision means starts fetching of the conditions of the output signals in response to a first trigger signal which is generated at a given time, and ends fetching of the conditions in response to a second trigger signal which is generated upon elapse of the predetermined time from the first trigger signal, thereby deciding the conditions of the output signals of the devices under test during the predetermined period of time between the first and second trigger signals.

* * * * *